(12) United States Patent
Zhang et al.

(10) Patent No.: US 8,366,474 B2
(45) Date of Patent: Feb. 5, 2013

(54) ELECTRONIC DEVICE AND RELEASING APPARATUS THEREOF

(75) Inventors: Guang-Yi Zhang, Shenzhen (CN); Meng-Qi Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 157 days.

(21) Appl. No.: 13/097,097

(22) Filed: Apr. 29, 2011

(65) Prior Publication Data

US 2012/0252238 A1 Oct. 4, 2012

(30) Foreign Application Priority Data

Apr. 1, 2011 (CN) .......................... 2011 1 0081477

(51) Int. Cl.
*H01R 13/62* (2006.01)

(52) U.S. Cl. ......................... 439/372; 439/928; 361/726

(58) Field of Classification Search .................. 439/372, 439/928; 361/726
See application file for complete search history.

(56) References Cited

U.S. PATENT DOCUMENTS

| | | | |
|---|---|---|---|
| 6,824,416 B2 * | 11/2004 | Di Mascio | 439/352 |
| 6,991,481 B1 * | 1/2006 | Guan et al. | 439/160 |
| 7,052,306 B2 * | 5/2006 | Ishigami et al. | 439/372 |
| 7,952,859 B2 * | 5/2011 | Peng | 361/679.02 |

* cited by examiner

*Primary Examiner* — Hien Vu
(74) *Attorney, Agent, or Firm* — Altis Law Group, Inc.

(57) ABSTRACT

An electronic device includes a housing, an electronic module received in the housing, a locking member fixed to the electronic module and locked to the housing, and a releasing apparatus fixed to the housing. The releasing apparatus includes a mounting member fixed to the bracket, an operation member slidably mounted to the mounting member, a first connecting member hinged to the mounting member, and a second connecting member hinged to the first connecting member and the operation member. The operation member is pushed to drive the first connecting member and the second connecting member to rotate to raise a junction of the first and second connecting members, to resist against the locking member to be deformed and released from the housing.

9 Claims, 5 Drawing Sheets

ELECTRONIC DEVICE AND RELEASING APPARATUS THEREOF

BACKGROUND

1. Technical Field

The disclosure relates to an electronic device and a releasing apparatus of the electronic device.

2. Description of Related Art

An electronic device, such as a server, may include a plurality of modules inserted in the housing of the electronic device. Each module often includes a hook to be locked to the housing. However, when the module needs to be pulled out from the housing, the space between the module and the housing may be too small to grasp and remove the module without great difficulty.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
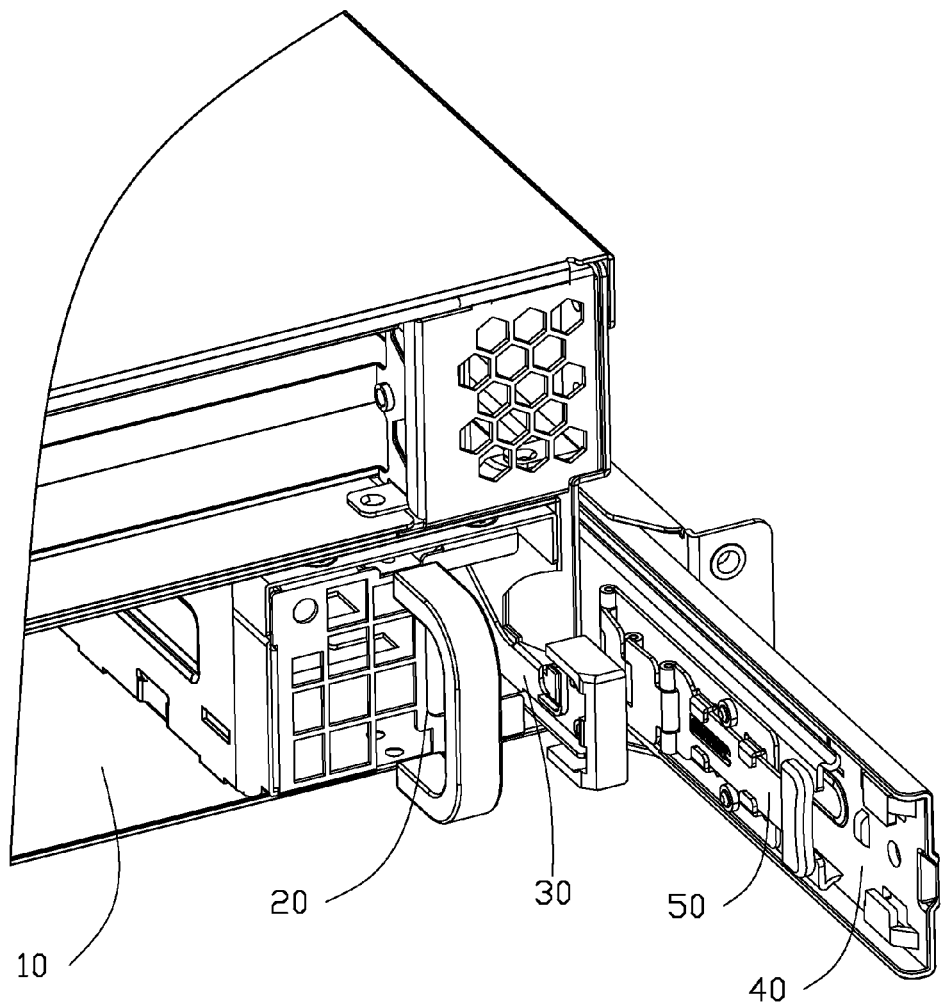
FIG. 1 is an assembled, isometric view of an exemplary embodiment of an electronic device.
Figure 2:
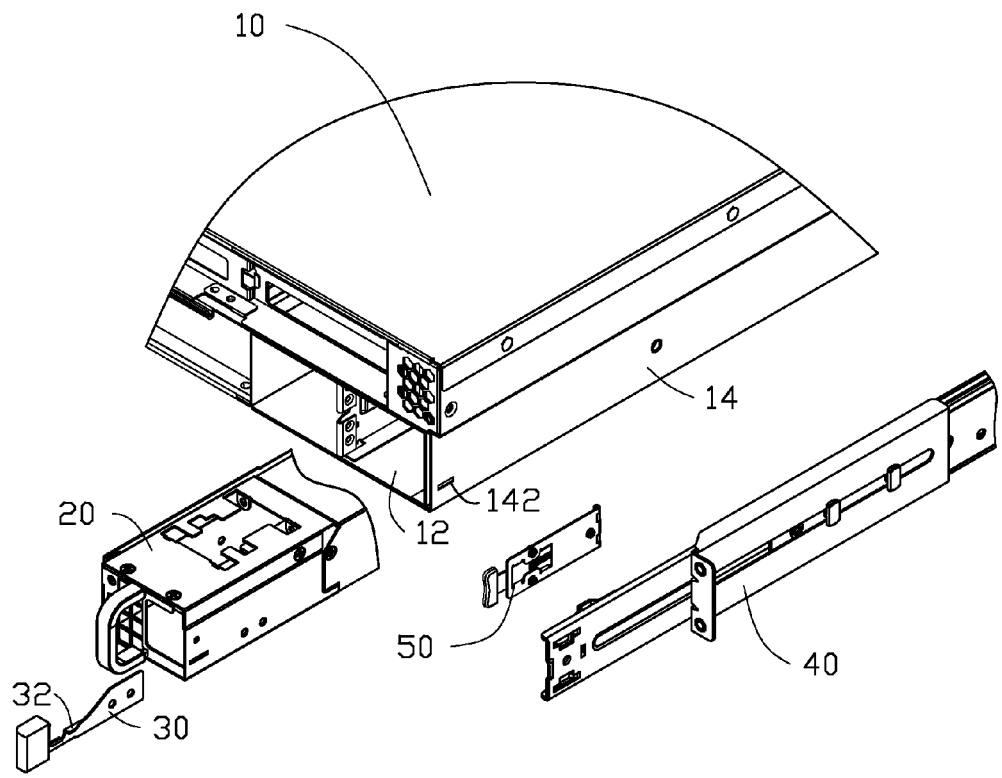
FIG. 2 is an exploded, isometric view of the electronic device of FIG. 1, the electronic device including a housing, an electronic module, a locking member, a bracket, and a releasing apparatus.

Referring to FIG. 1 and FIG. 2, an exemplary embodiment of an electronic device includes a housing 10, an electronic module 20, a locking member 30, a bracket 40, and a releasing apparatus 50.

The housing 10 includes a side plate 14 and a receiving portion 12 bounded on one side by the side plate 14. A locking slot 142 is defined in the side plate 14.

In the disclosure, the electronic module 20 is a power supply unit received in the receiving portion 12 of the housing 10. A first end of the locking member 30 is fixed to an outer surface of the electronic module 20. The locking member 30 is a metal piece and includes a locking piece 32 adjacent to a second end of the locking member 30 opposite to the first end, to engage in the locking slot 142 of the housing, thereby fixing the module 20 in the receiving portion 12.

The bracket 40 is fixed to an outer surface of the side plate 14 of the housing 10. In the disclosure, the bracket 40 is a slide rail for slidably mounting the housing 10 to a cabinet (not shown in figures). The releasing apparatus 50 is fixed to the bracket 40 and faces the side plate 14 of the housing 10.

Figure 3:
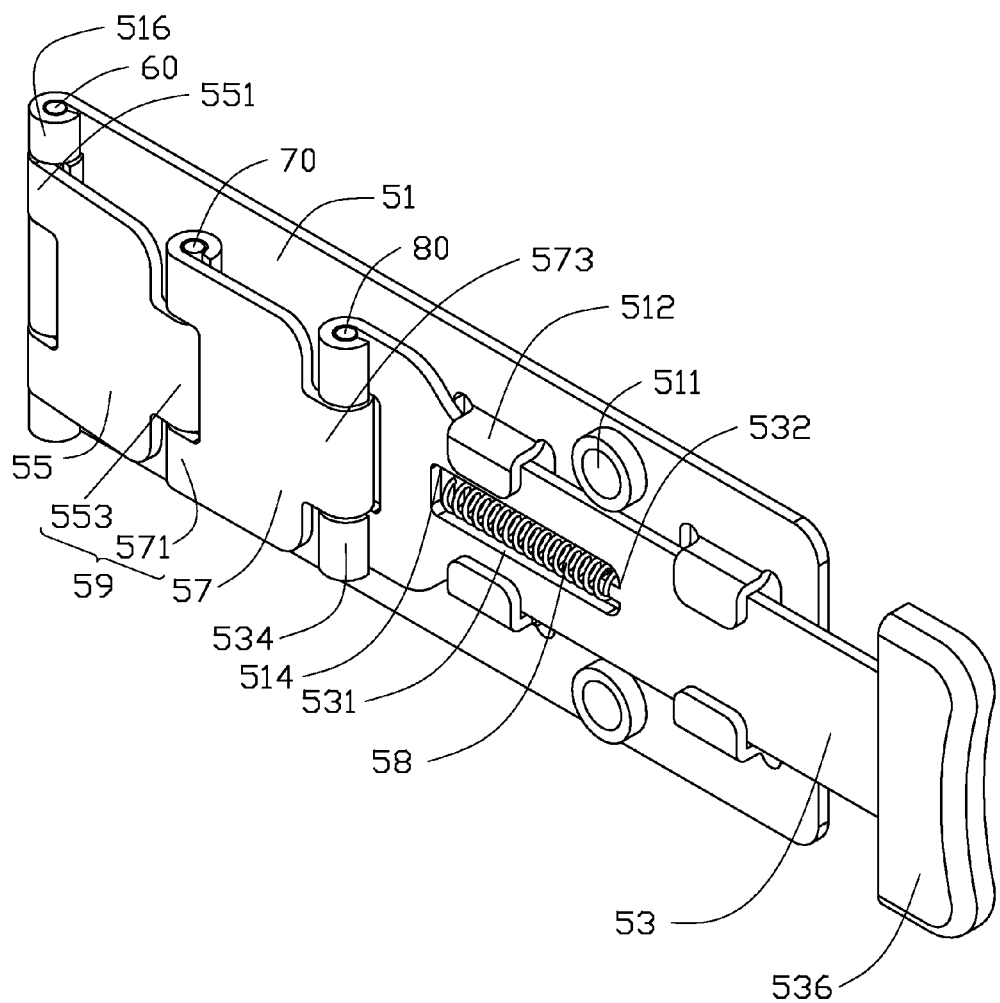
FIG. 3 and FIG. 4 are enlarged views of the releasing apparatus of FIG. 2, but showing different states of use.
Figure 4:
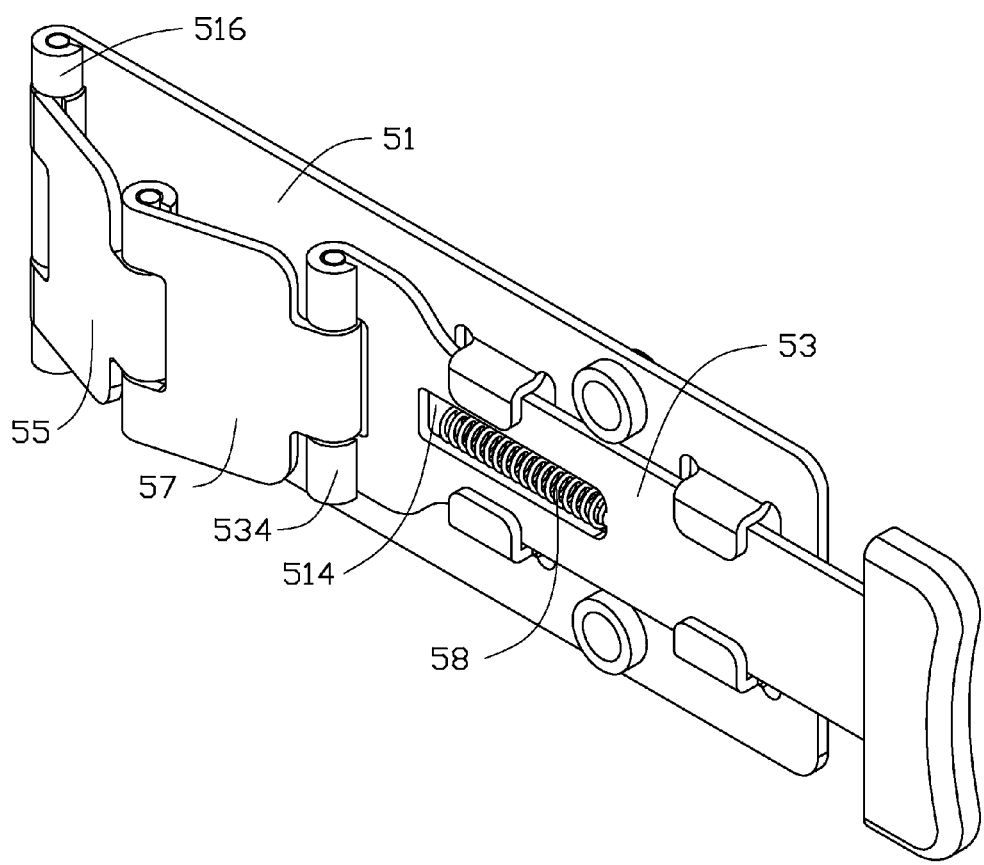

Referring to FIG. 3 and FIG. 4, the releasing apparatus 50 includes a mounting member 51, an operation member 53, a first connecting member 55, a second connecting member 57, and a resilient member 58.

The mounting member 51 is substantially a plate and defines a plurality of mounting holes 511 for mounting the mounting member 51 to the bracket 40. Three coaxial pivot portions 516 are formed at a first end of the mounting member 51. Two pairs of L-shaped locating portions 512 are formed on a second end of the mounting member 51. A tab 514 protrudes from a middle of the mounting member 51, between the pivot portions 516 and the locating portions 512.

The operation member 53 is slidably arranged between the locating portions 512 and the mounting member 51. A handle 536 is set at a first end of the operation member 53. Two coaxial pivot portions 534 are formed from a second end of the operation member 53. The operation member 53 longitudinally defines a slot 531 therein. A pin 532 extends from one sidewall bounding the slot 531 adjacent to the handle 536.

In the disclosure, the resilient member 58 is a helical spring. The resilient member 58 is received in the slot 531 of the operation member 53, with a first end of the resilient member 58 fitting about the tab 514 of the mounting member 51. A second end of the resilient member 58 resists against the tab 514 of the mounting member 51 away from the handle 536.

Two spaced pivot portions 551 are formed from a first end of the first connecting member 55. The first end of the first connecting member 55 is pivotably connected to the first end of the mounting member 51 through a shaft 60 extending through pivot portions 551 and the pivot portion 516 adjacent to the first distal end of the mounting member 51. A pivot portion 553 is formed from a middle of a second end of the first connecting member 55. The second connecting member 57 is similar as the first connecting member 55 in structure. The second connecting member 57 includes two pivot portions 571 at a first end and a pivot portion 573 at a second end. The first end of the second connecting member 57 is pivotably connected to the second end of the first connecting member 55 through a shaft 70 extending through the pivot portion 553 of the first connecting member 55 and the pivot portions 571 of the second connecting member 57. The second end of the second connecting member 57 is pivotably connected to the second end of the operation member 53 through a shaft 80 extending through the pivot portions 534 of the operation member 53 and the pivot portion 573 of the second connecting member 57. The pivot portion 553 of the first connecting member 55 and the pivot portions 571 together form an engaging part 59.

Figure 5:
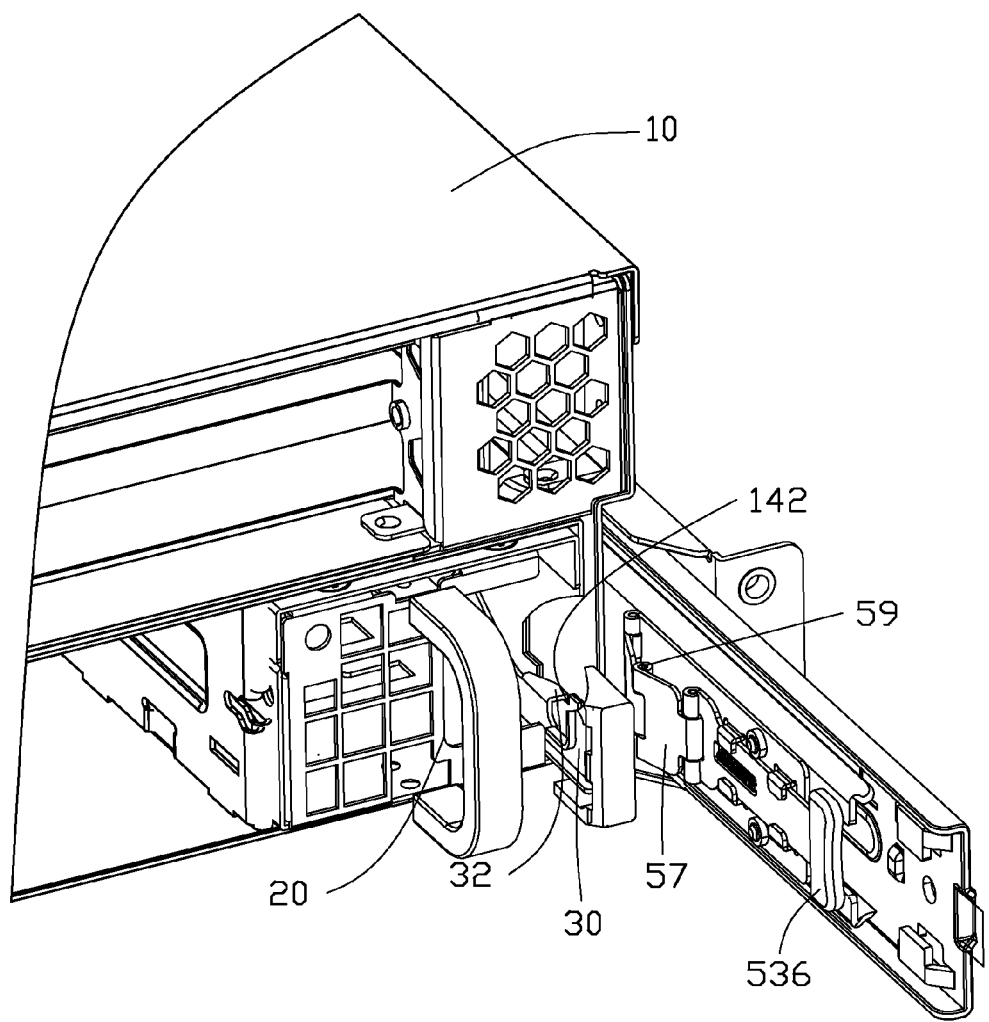
FIG. 5 is similar to FIG. 1, but showing a different state of use.

Referring to FIG. 5, to release the electronic module 20 from the housing 10, the handle 536 is operated to deform the resilient member 58 and slide the operation member 53 inward relative to the mounting member 51, thereby driving the first connecting member 55 and the second connecting member 57 to rotate to raise the engaging part 59 away from the mounting member 51. The engaging part 59 resists against the locking member 30 to deform the locking member 30 toward the electronic module 20, until the locking piece 32 is released from the locking slot 142. The electronic module 20 can be pulled out from the housing 10.

In an alternative embodiment, the releasing apparatus 50 may be directly fixed to the outer surface of the side plate 14 of the housing 10.

In the disclosure, the electronic device includes a releasing apparatus 50 attached to the housing 10 to release the electronic module 20 from the housing, which is convenient to use.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
   a housing comprising a side plate and a receiving portion bounded on one side by the side plate, the side plate defining a locking slot;
   an electronic module received in the receiving portion of the housing;
   a locking member fixed to the electronic module and comprising a locking piece locked in the locking slot of the side plate of the housing;
   a bracket fixed to an outer surface of the side plate of the housing; and
   a releasing apparatus comprising a mounting member fixed to the bracket opposite to the side plate, an operation member slidably mounted to the mounting member, a first connecting member, and a second connecting member;
   wherein a first end of the first connecting member is pivotably connected to a first end of the mounting member, a first end of the second connecting member is pivotably connected to a second end of the first connecting member, a second end of the second connecting member is pivotably connected to a first end of the operation member;
   wherein a junction of the first connecting member and the second connecting member forms an engaging part; and
   wherein the operation member is operable to drive the first connecting member and the second connecting member to rotate to raise the engaging part away from the mounting member, thereby resisting against the locking member to deform the locking member to release from the locking slot of the housing.

2. The electronic device of claim 1, wherein the electronic module is a power supply.

3. The electronic device of claim 1, wherein the locking member is a metal piece.

4. The electronic device of claim 1, wherein the releasing apparatus is fixed to the bracket and faces the side plate of the housing.

5. The electronic device of claim 1, wherein the bracket is a slide rail module.

6. A releasing apparatus comprising:
   a mounting member;
   an operation member slidably mounted to the mounting member that is fixed to a bracket being mounted on an electronic device;
   a first connecting member; and
   a second connecting member, wherein a first end of the first connecting member is pivotably connected to an end of the mounting member, a first end of the second connecting member is pivotably connected to a second end of the first connecting member, a second end of the second connecting member is pivotably connected to an end of the operation member, a junction of the first and second connecting members forms an engaging part;
   wherein the operation member is operable to move toward the end of the mounting member to drive the first connecting member and the second connecting member to rotate to raise the engaging part away from the mounting member; a plurality of holding locating portions are formed on the mounting member, the operation member is slidably arranged between the locating portions and the mounting member.

7. The releasing apparatus of claim 6, wherein the holding locating portions are L-shaped locating portions.

8. The releasing apparatus of claim 6, further comprising a resilient member, wherein the operation member defines a slot, a pin extends from one sidewall bounding the slot, a tab protrudes on a middle of the mounting member away from the pin, the resilient member is received in the slot, a first end of the resilient member resists against the tab, a second end of the resilient member fits about the pin, thereby the resilient member biases the operation member to move away from the end of the mounting member, thereby biasing the engaging part to move toward the mounting member.

9. The releasing apparatus of claim 6, wherein a plurality of coaxially first pivot portions are formed at the end of the mounting member, two coaxially second pivot portions are formed from the end of the operation member, two coaxially third pivot portions are formed from the first end of the first connecting member, the first end of the first connecting member is pivotably connected to the end of the mounting member through a first shaft extending through third pivot portions of the first end of the first connecting member and the first pivot portions of the mounting members, a fourth pivot portion is formed from a middle of the second end of the first connecting member, the second connecting member comprises two coaxially fifth pivot portions at the first end and a sixth pivot portion at the second end, the first end of the second connecting member is pivotably connected to the second end of the first connecting member through a second shaft extending through the fourth pivot portion of the second end of the first connecting member and the sixth pivot portions of the first end of the second connecting member, the second end of the second connecting member is pivotably connected to the end of the operation member through a third shaft extending through the second pivot portions of the end of the operation member and the sixth pivot portion of the second end of the second connecting member.

* * * * *